United States Patent [19]
Hedrick et al.

[11] Patent Number: 6,111,961
[45] Date of Patent: Aug. 29, 2000

[54] AMPLIFIER FOR A GUITAR OR OTHER MUSICAL INSTRUMENT

[75] Inventors: Guy L. Hedrick, Hillsdale; Franco LaMarra, West Bloomfield, both of Mich.

[73] Assignee: Guytron, LLC, Brookings, Oreg.

[21] Appl. No.: 08/890,492

[22] Filed: Jul. 9, 1997

Related U.S. Application Data

[60] Provisional application No. 60/016,098, Jul. 9, 1996.

[51] Int. Cl.[7] ................................................ H03G 3/00
[52] U.S. Cl. ............................................ 381/61; 381/120
[58] Field of Search ................................. 381/61–62, 28, 381/56, 319, 77, 103, 104, 120–121; 84/701; 330/278, 254

[56] References Cited

U.S. PATENT DOCUMENTS

| | | | |
|---|---|---|---|
| 3,973,461 | 8/1976 | Jahns | 84/701 |
| 4,405,832 | 9/1983 | Soundermeyer | 381/61 |
| 4,495,640 | 1/1985 | Frey | 381/61 |
| 4,701,957 | 10/1987 | Smith | 381/61 |
| 4,811,401 | 3/1989 | Brown, Sr. et al. | 381/61 |
| 4,890,331 | 12/1989 | Brown, Sr. et al. | 381/61 |
| 4,937,874 | 6/1990 | Pittman et al. | . |
| 4,995,084 | 2/1991 | Pritcherd | 381/61 |
| 5,012,199 | 4/1991 | McKale | 381/61 |
| 5,133,015 | 7/1992 | Scholz | 381/61 |
| 5,268,527 | 12/1993 | Waller, Jr. | 381/61 |
| 5,727,069 | 3/1998 | Hughes et al. | 381/61 |

*Primary Examiner*—Forester W. Isen
*Assistant Examiner*—Xu Mei
*Attorney, Agent, or Firm*—Reising, Ethington, Barnes, Kisselle, Leearman & McCulloch, P.C.

[57] ABSTRACT

A musician's amplifier that produces an overdriven amplifier sound at any desired listening level by including an output section complete with audio power devices and a high-wattage dummy load in the pre-amplifier section of the amplifier. The audio power devices are overdriven to taste, and the results are then fed into a power amplifier section of the amplifier using a master volume control to set the desired listening level. The amplifier can include an effects loop and a tone control circuit in the power amplifier section. With this arrangement, the musician is able to accurately produce both overdriven and undistorted amplifier tones at many different listening levels with a single amplifier.

20 Claims, 8 Drawing Sheets

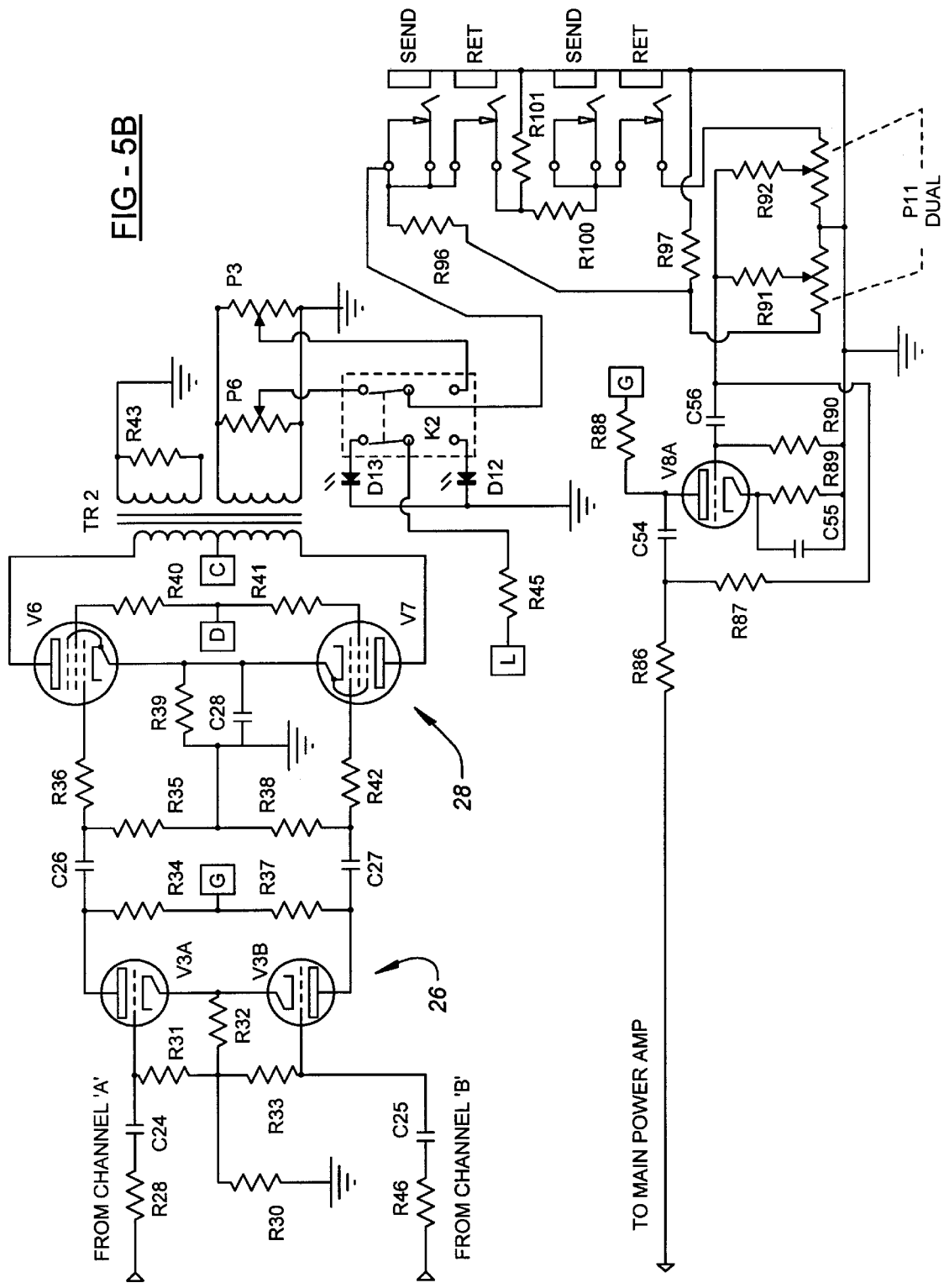

6,111,961

AMPLIFIER FOR A GUITAR OR OTHER MUSICAL INSTRUMENT

This application claims benefit of U.S. Provisional Application No. 60/016,098 filed Jul. 9, 1996.

TECHNICAL FIELD

This invention relates in general to amplifiers used with musical instruments and, more particularly, to guitar amplifiers.

BACKGROUND OF INVENTION

At their inception, guitar amplifiers were designed to merely amplify the sound of a guitar or other instrument and provide basic control over the tonality of the music being played. One such amplifier is shown in FIG. 1. It includes a first amplifier stage that buffers the incoming audio signal, a volume control, tone controls, a second amplifier stage, a third amplifier stage (which can include an effects mixer if reverberation or effects circuitry are utilized), and an output stage for providing the necessary driving power for the speakers.

In the early days of rock and roll, volume requirements exceeded power availability and, at these higher volume levels, the amplifiers produced an overdriven or distorted sound that became very popular. This type of guitar sound has now been widely used in popular music for over thirty years.

One problem that musicians encounter is achieving this overdriven sound at lower volume levels. Since this sound results from the amplifier being overdriven (i.e., at maximum volume), it cannot be created using conventional amplifiers at lower volume levels. Often, this makes it difficult to provide both the desired tonality for the music being played and the appropriate listening level for the particular setting in which the music is being played. Thus, for instance, an amplifier may produce one guitar sound at the limits of its power capabilities, but for a particular performance the volume requirements may be much less, and turning the amplifier down will yield a completely different tone.

Amplifier engineers have attacked this problem in different ways, but with limited results and, consequently, professional musicians usually own a variety of amplifiers in order to accommodate different situations.

A first approach to solving this problem was to add master volume control, as shown in the prior art amplifier circuit of FIG. 2. This essentially allowed the musician to turn up the pre-amplifier section to the desired overdrive level and regulate the amount of signal that went to the power amplifier section. Although better than the earlier amplifier designs, this design did not provide enough overdrive and it was not as sensitive to the guitarist's touch.

A second approach was a response to the first approach and its inherent shortcomings. As shown in the prior art amplifier circuit of FIG. 3, this approach involved adding more overdrive in the pre-amplifier section, by cascading voltage amplifiers before the master volume, in an effort to compensate for the loss in overdrive incurred by not including the output stage in the overdrive process. Although considered by most to be better than earlier designs, this approach still resulted in different sounds at different power levels and, as with the earlier designs, there was therefore an optimum power level at which the desired overdriven guitar sound was produced.

A third approach involved varying the power capacity of the output section to get it working harder. This was done by starving the outputs for voltage or impedance mismatch, or both. This feature was sometimes offered with the new high-gain pre-amplifiers and different versions of this approach have been state of the art since the early 1970's. However, the trend of owning a library of different amplifiers is still prevalent and still growing among most professional musicians.

SUMMARY OF THE INVENTION

In accordance with the present invention, there is provided a musician's amplifier that permits the musician to produce an overdriven sound over a wide range of different volume levels. The amplifier includes a pre-amplifier section and a power amplifier section. The pre-amplifier section has at least one amplifier stage that includes a captive output stage that is complete with audio power devices and a dummy load. The amplifier stage has a gain that is adjustable between a low gain setting and a high gain setting, wherein the audio power device(s) in the captive output stage are overdriven when the gain is at the high gain setting.

The power amplifier section has at least one output stage coupled to the captive output stage of the pre-amplifier section to receive the amplified audio signals therefrom. The output stage has a volume control and one or more audio power devices for driving a speaker. By providing a complete output stage in the pre-amplifier section, the pre-amplifier section can produce an overdriven sound that is used by the audio power device(s) of the power amplifier section to drive the speaker at a volume level set by the volume control. This permits the musician to select the desired amount of overdrive irrespective of the volume level at which the music is played.

In another aspect of the invention, a complete captive output stage, together with audio power devices and a dummy load, are included in a standalone device that can be connected to the external effects loop of a conventional musician's amplifier. In this way, the desired overdriven sound can be achieved at any volume level using a conventional, pre-existing amplifier.

In another aspect of the invention, the captive output stage can be incorporated into the front end of a standalone power amplifier, which can then be used with an existing conventional pre-amplifier.

In yet another aspect of the invention, the captive output stage can be incorporated into the back end of a standalone pre-amplifier, which can then be used with a existing conventional power amplifier.

BRIEF DESCRIPTION OF THE DRAWINGS

A preferred exemplary embodiment of the present invention will hereinafter be described in conjunction with the appended drawings, wherein like designations denote like elements, and:

FIGS. 5a through 5c together comprise a schematic circuit of the musician's amplifier of FIG. 4;

DESCRIPTION OF THE PREFERRED EMBODIMENTS

Figure 1:
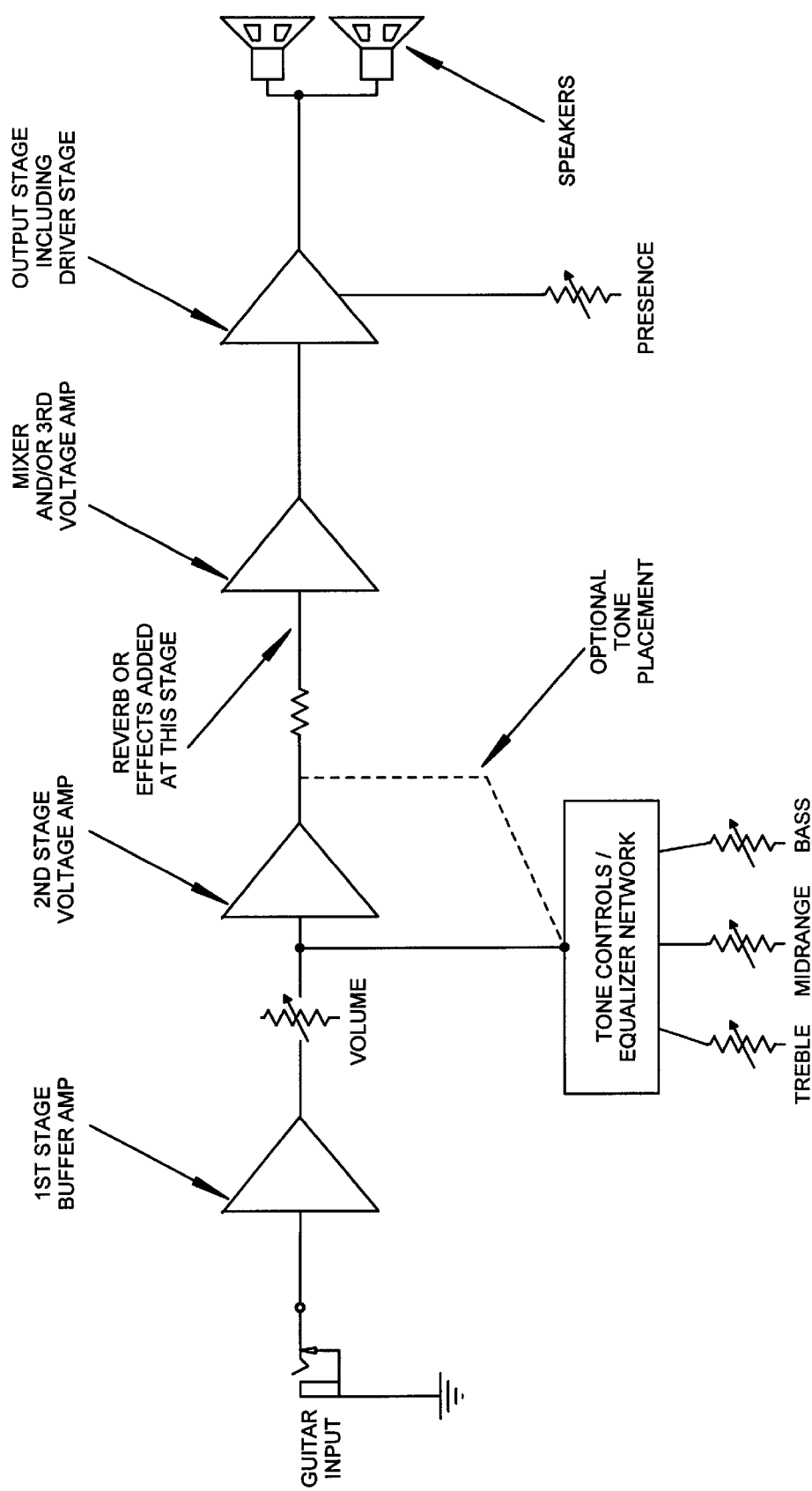
FIG. 1 is a block diagram of a prior art guitar amplifier.
Figure 2:
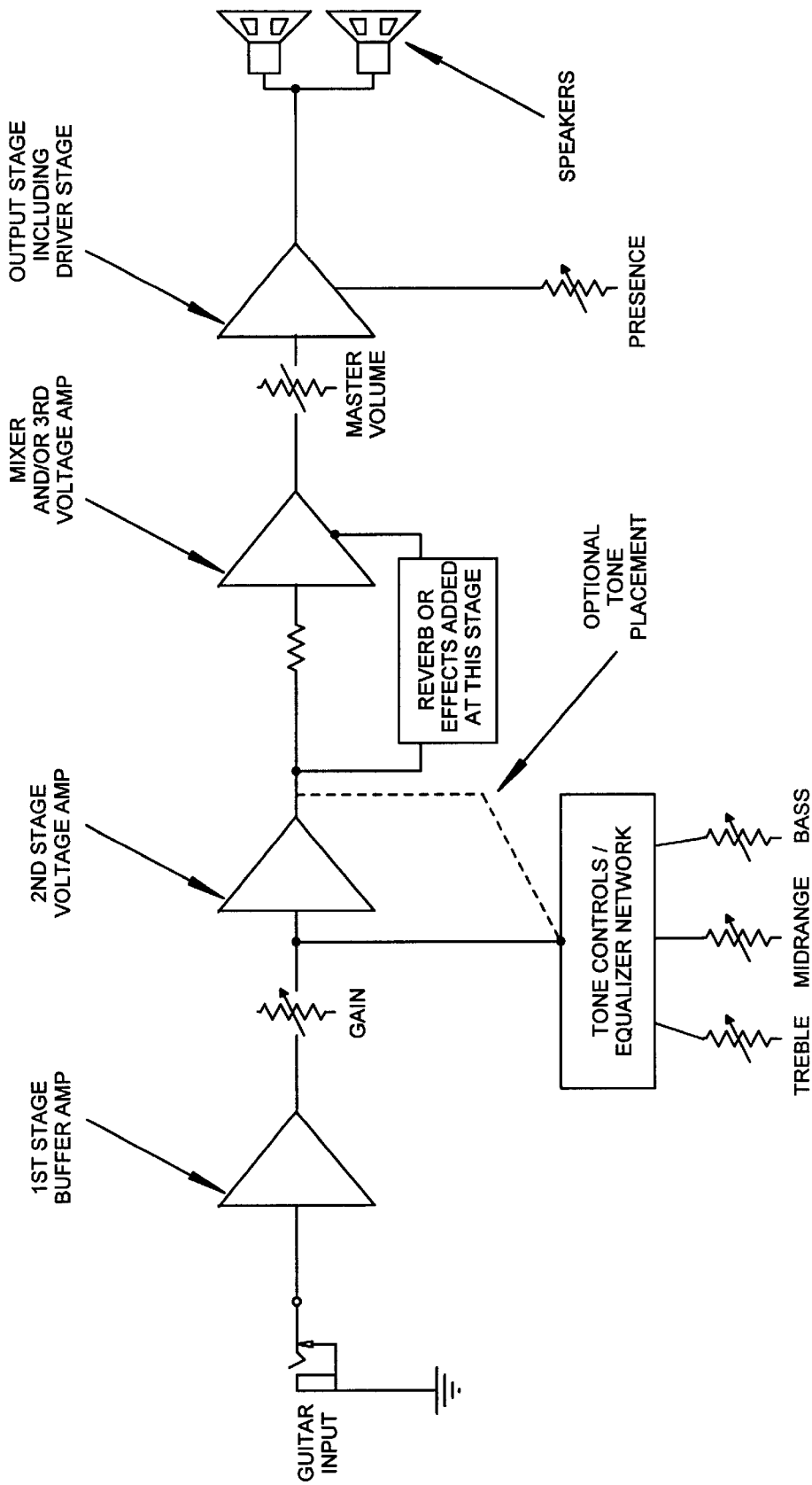
FIG. 2 is a block diagram of a second prior art guitar amplifier.
Figure 3:
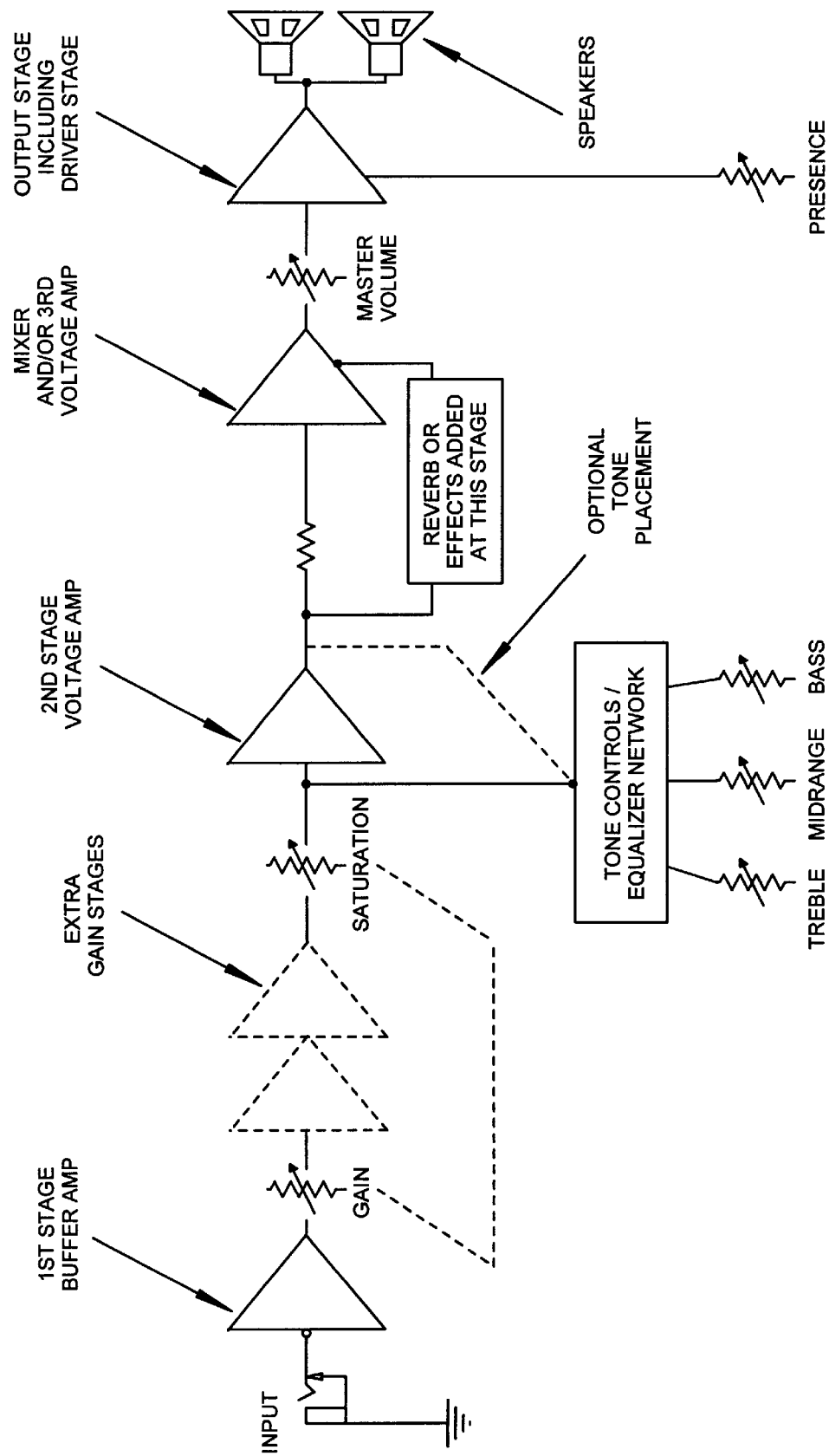
FIG. 3 is a block diagram of a third prior art guitar amplifier.
Figure 4:
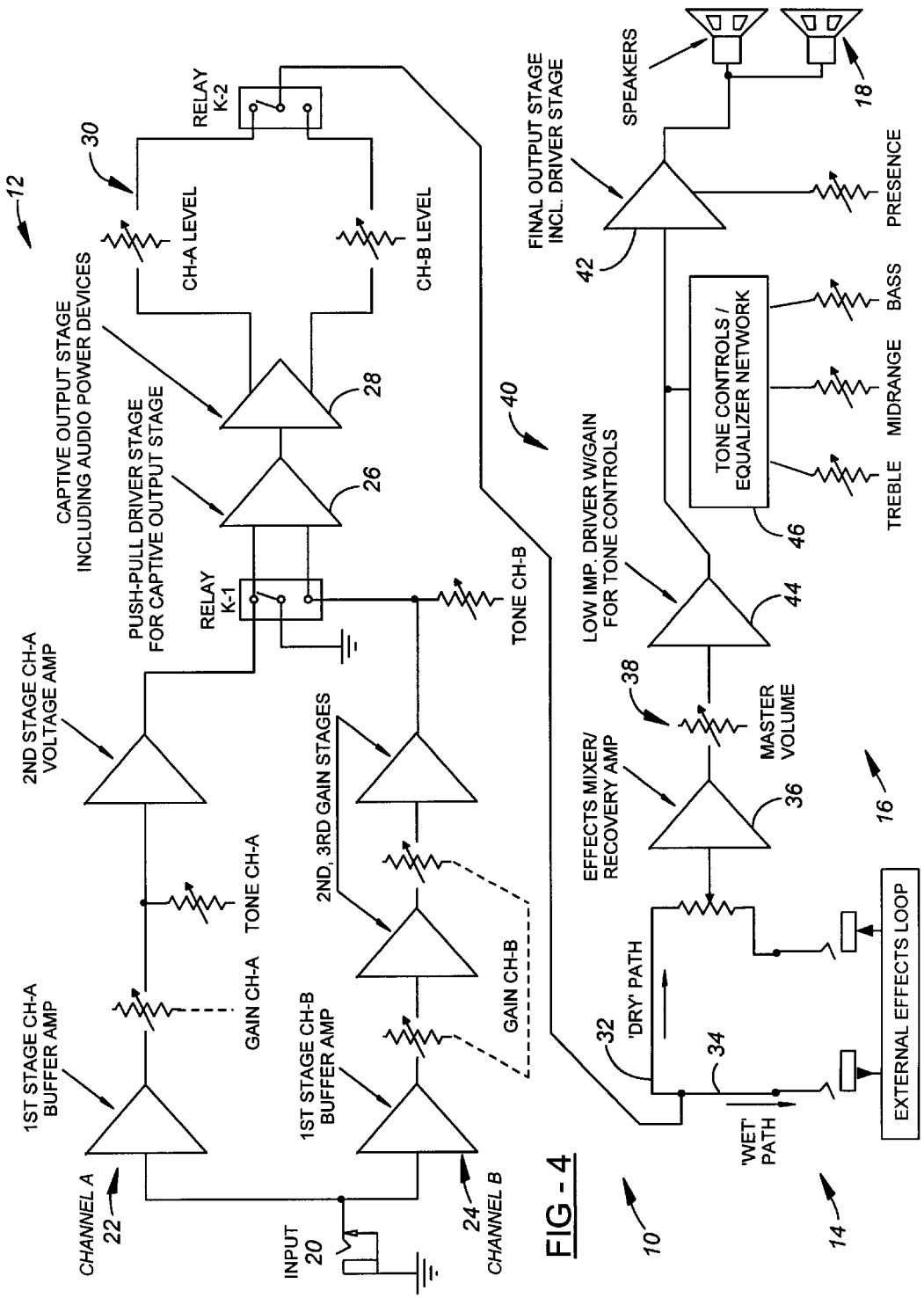
FIG. 4 is a block diagram of a first embodiment of the musician's amplifier of the present invention.
Figure 5A:
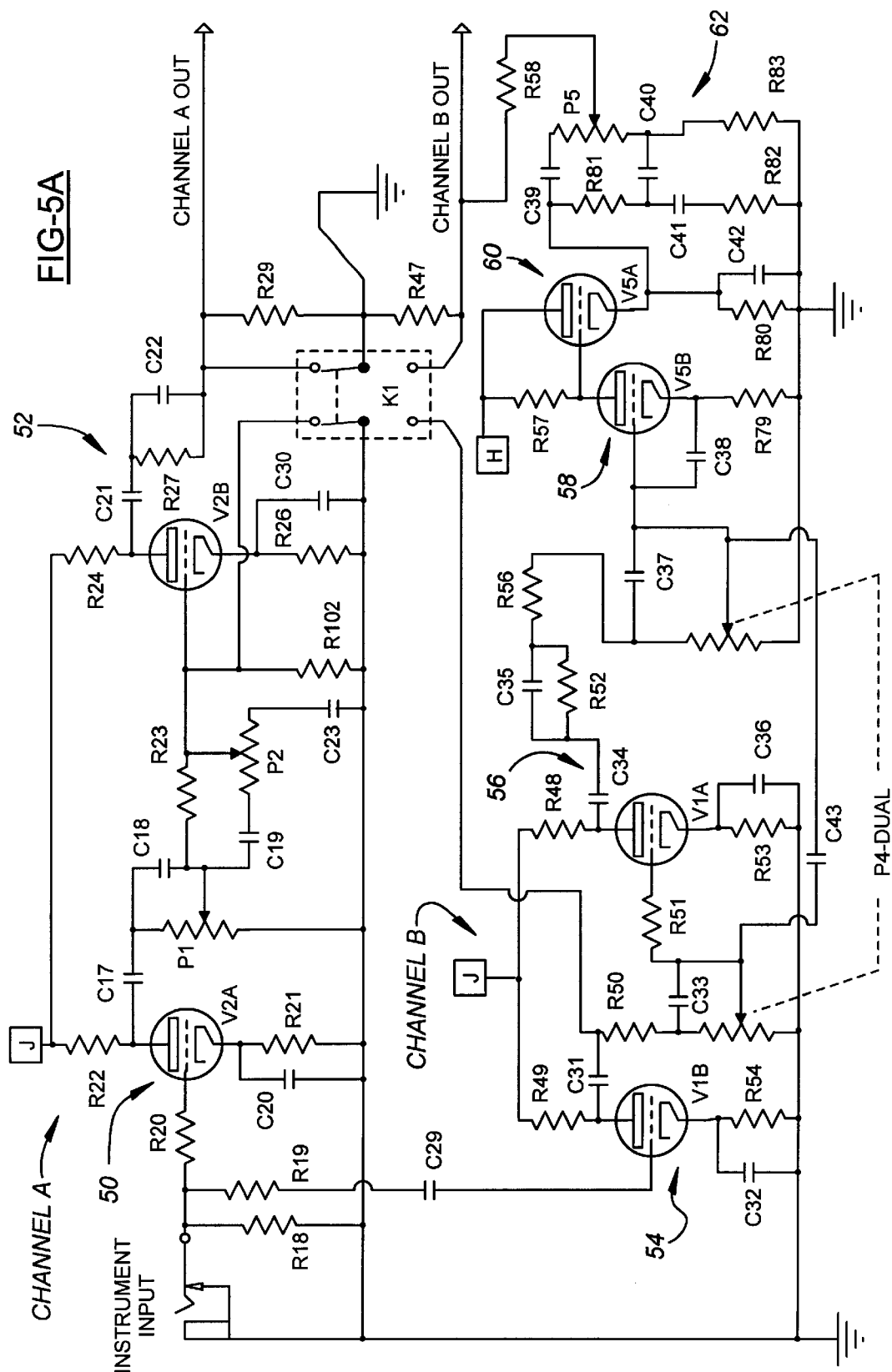
Figure 5C:
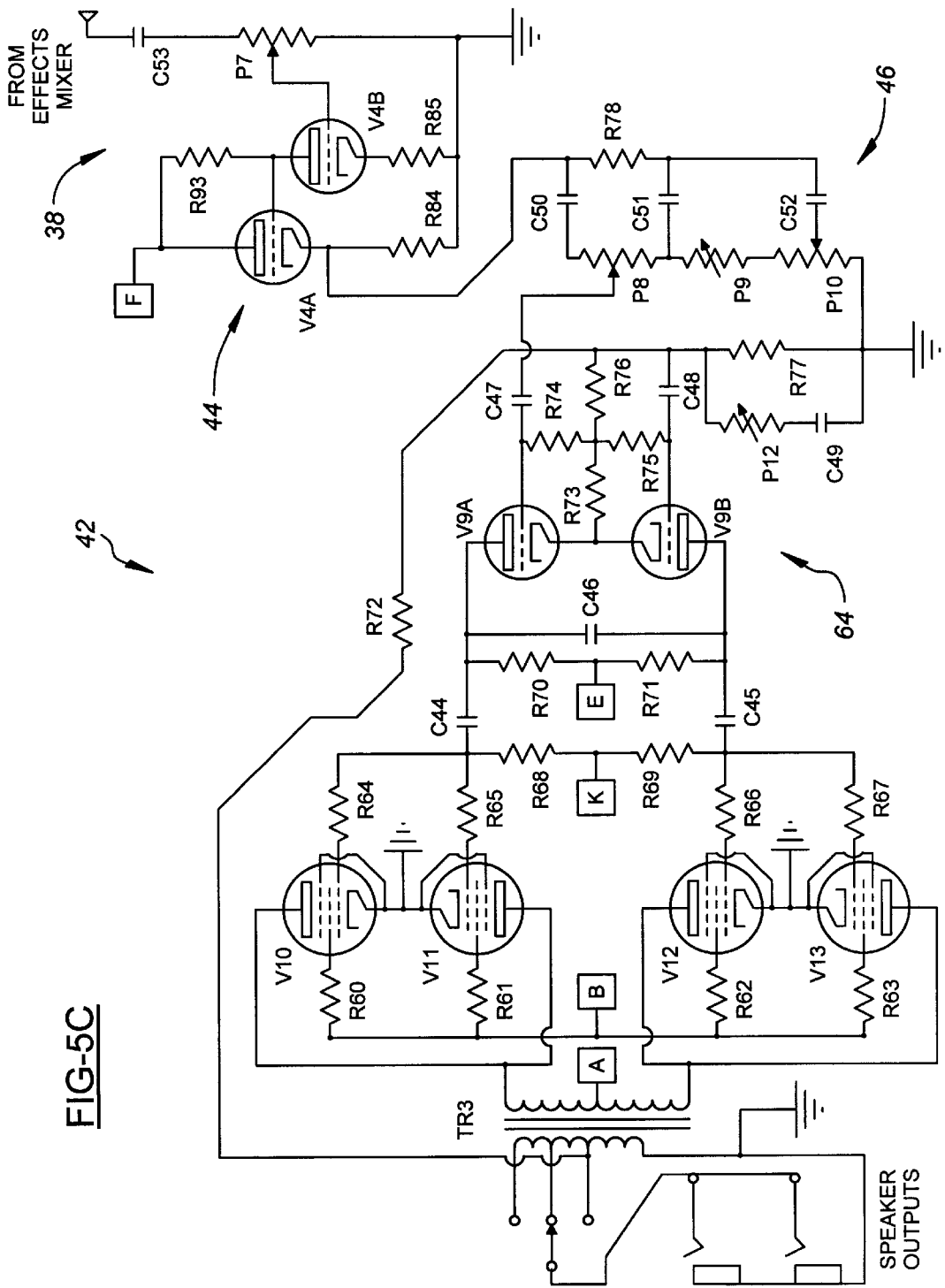

A first embodiment of the invention is illustrated in block diagram form in FIG. 4, as well as schematically in FIGS. 5a through 5c for a 100 watt amplifier. In general, the illustrated embodiment achieves the desired amplifier sound at any power level by utilizing a complete output stage in the pre-amplifier section that can be overdriven to the desired level. This output stage includes audio power tubes, an output transformer, and a dummy load to dissipate the power provided by the audio power tubes. The audio signal generated by this output stage includes the desired distortion that results from the audio power tubes being overdriven. This audio signal is then provided to a power amplifier section, which includes a master volume control that permits the musician to select whatever volume level is desired.

Referring now to FIG. 4, there is illustrated a guitar amplifier that is designated generally as 10. Amplifier 10 includes a pre-amplifier section, designated as 12, an effects section, designated as 14, a power amplifier section, designated as 16, and a pair of speakers 18. Pre-amplifier section 12 can be used to adjust the desired tonality and distortion of the audio signal received from the guitar or other musical instrument. Effects section 14 permits various effects to be added to the audio signal using an external effects loop. Power amplifier section 16 provides the power needed to drive speakers 18 at whatever volume is selected by the musician.

Pre-amplifier section 12 includes an input 20, a first channel A, designated as 22, a second channel B, designated as 24, a driver stage 26, a captive output stage 28, pre-amplifier level control 30, and a pair of relays K-1 and K-2 that permit switching between channels A and B. Channel A is a two-stage pre-amplifier that provides low to medium gain. Channel B is a four-stage pre-amplifier that provides extremely high gain and compression. Both of these channels have an adjustable gain that can be used to overdrive captive output stage 28 to thereby provide a truly overdriven sound. The construction and operation of these two channels will be described more fully below in connection with FIG. 5a. Driver stage 26 provides the necessary drive signals for captive output stage 28, which is a complete audio power output stage including audio power devices, an output transformer, and a dummy load. Pre-amplifier level control 30 permits the amplified audio signal from output stage 28 to be attenuated to the proper level for inputting to the effects section 14 and, ultimately, the power amplifier section 16.

Effects section 14 includes both a dry signal path 32 and a wet signal path 34 for connection to conventional external effects equipment (not shown). These paths run in parallel and rejoin at an effects mixer stage 36 that permits the signal from the dry signal path 32 to be mixed with the signal (if any) from the wet signal path 34.

Power amplifier section 16 includes a master volume control 38, a tone control stage 40, and a second, or final, output stage 42. Master volume control 38 determines the actual volume level provided by speakers 18. Tone control stage 40 includes a low impedance driver 44 and a tone control circuit 46 that permits adjustment of the relative levels of treble, midrange, and bass tones. Output stage 42 includes the audio power devices and output transformer used to drive speakers 18.

Referring now to FIG. 5a, channels A and B of pre-amplifier section 12 will now be described. Channel A includes an initial buffer gain stage 50 connected to receive input audio signals from a guitar or other musical instrument connected to input 20. Channel A also includes a second voltage gain stage 52. Potentiometer P1 allows the musician to adjust the gain of stage 52 to a desired level. In particular, the gain can be set anywhere from a minimal gain setting to a high gain setting that is pre-selected to cause the captive output stage 28 to be overdriven. Potentiometer P2 provides tone control. The output of this stage is labelled "CHANNBL A OUT" and is provided to driver stage 26 of FIG. 5b, as will be described further below.

Channel B includes an initial buffer gain stage 54, a second voltage gain stage 56, a third voltage gain stage 58, a unity gain stage 60, and a tone network 62. Potentiometer P4 is a dual-potentiometer that provides simultaneous gain control of both voltage gain stages 56 and 58. As in channel A, when this potentiometer is set for high gain, the captive output stage 28 will be overdriven to provide the desired distortion in the signal outputted by pre-amplifier section 12. Unity gain stage 60 includes a tube V5A connected as a cathode follower to provide a low impedance drive to the tone network 62. Potentiometer P5 provides tone control for this channel. The output of this stage is labelled "CHANNEL B OUT" and is provided to driver stage 26 along with the output from channel A. As mentioned above, relay K-1 is used to switch between channels A and B. This is accomplished by shorting the output of the undesired channel to ground.

Referring now to FIG. 5b, the outputs of channels A and B are connected to driver stage 26, which comprises a cathode-coupled phase inverter that creates a push/pull balanced class A driver circuit for captive output stage 28. Captive output stage 28 is an amplifier stage that includes a pair of audio power devices in the form of two audio power tubes V6 and V7 that drive an output transformer TR2 having its low impedance secondary loaded down with a dummy load R43 of eight ohms. The dummy load R43 permits the audio power tubes V6 and V7 to be properly loaded down so that they can be overdriven by setting the pre-amplifier gain high. Normally, such a dissipation of electrical power as heat would be considered inefficient and undesirable. However, as will be appreciated by those skilled in the art, by providing a complete, captive output stage and dummy load in the pre-amplifier section, the audio power devices of this output stage can be overdriven in the same manner as the output stage of a conventional power amplifier, resulting in the desired overdriven sound being produced in the pre-amplifier section. In this way, the master volume control of the power amplifier stage can then be used to provide this desired sound at whatever volume level is desired.

Transformer TR2 includes a second secondary winding connected across potentiometers P3 and P6 that provide level control for channels A and B, respectively. This level control allows the musician to attenuate the amplified audio signals generated by audio power tubes V6 and V7 before they are provided to power amplifier section 16 by way of effects section 14. Relay K-2 is used to select between the attenuated signals produced by potentiometers P3 and P6. This relay is activated jointly and simultaneously with relay K-1 by either a footswitch or a front panel switch on the amplifier's housing (none of which are shown).

The output of relay K-1 represents the output of the pre-amplifier section 12 of the first embodiment. This output is provided to effects section 14 which includes the dry signal path through resistor R96 and the wet signal path that includes the two illustrated sets of send and return jacks. The upper set provides a +3 db effects loop and the lower set provides a −10 db effects loop due to the voltage divider created by R100 and R101. Potentiometer P11 is a dual potentiometer that is used to create an effects mixer that blends the signals appearing on the dry and wet signal paths. These signals are summed at the grid of tube V8A which comprises the heart of effects mixer stage 36. The output of this stage is then supplied to power amplifier section 16 of FIG. 5c, which will now be described.

At the front of power amplifier section 16 is volume control 38, which includes a master volume potentiometer P7 connected to the input of a voltage gain stage formed from a tube V4B. The output of this stage is provide to the low impedance driver 44 that is connected as a cathode-follower to provide a low-impedance source for the tone control circuit 46. Potentiometers P8, P9, and P10 are used in the tone control circuit 46 to provide master control over the treble, bass, and midrange tones, respectively.

The output of the tone control circuit 46 is provided to the input of output stage 42. In particular, output stage 42 includes a driver stage 64 of essentially the same design as that of driver stage 26 used in the pre-amplifier section 12. Inverse feedback from output transformer TR3 is supplied to driver stage 64 in an amount controlled by master presence potentiometer P12. The output of driver stage 64 is connected to two sets of audio power tubes V10–V13, with the tubes of each set being connected in parallel with each other to supply the total power needed to drive speakers 18 with one hundred watts of power. These audio power tubes are connected to transformer TR3 which provides on its secondary the proper impedance necessary for driving speakers 18. The secondary is connected to a pair of speaker outputs which together comprise the output of power amplifier section 16.

As will be appreciated by those skilled in the art, since the power amplifier section does not need to produce overdrive, there is no trade-off between overdrive and volume. Moreover, since the pre-amplifier section includes a complete output stage, the overdrive it produces has the same harmonic content and touch sensitivity as an overdriven conventional amplifier.

Although the illustrated embodiment of FIGS. 4 and 5a–5c includes two separate channels to provide different levels of gain, it will be appreciated that the pre-amplifier section need only have one gain stage that is used to drive the captive output stage at the desired level. Also, as shown, the final power amplifier section can, if desired, include circuitry for an external effects loop as well as equalization to further shape the tone. Other additional circuitry can be included without departing from the invention.

The following table lists highly preferred values for the components in FIGS. 5a–5c. Preferably, tubes V1 through V5 are equipped with dc heaters.

| Part No. | Part Description |
|---|---|
| C15 | 100 pdisc |
| C16 | .01/50 vdisc |
| C17 | .0047/400 v |
| C18 | 100 pfdisc |
| C19 | 500 pfdisc |
| C20 | 220 uf/16 v-rad |
| C21 | .022/600 v |

-continued

| Part No. | Part Description |
|---|---|
| C22 | 270 pfdisc |
| C23 | .0047/600 |
| C24 | .022/600 v |
| C25 | .022/600 v |
| C26 | .1/400 v |
| C27 | .1/400 v |
| C28 | 200 uf/25 v-rad |
| C29 | .022/600 v |
| C30 | .022/600 v |
| C31 | .0022/600 v |
| C32 | .68/100 v |
| C33 | 100 pfdisc |
| C34 | .0022/600 v |
| C35 | .0022/600 v |
| C36 | .22/100 v |
| C37 | 220 pfdisc |
| C38 | 47 pdisc |
| C39 | 470 pfdisc |
| C40 | .022/600 v |
| C41 | .022/600 v |
| C42 | .001/600 v |
| C43 | 10 pfdisc |
| C44 | 0.47/600 v |
| C45 | 0.47/600 v |
| C46 | 47 pdisc |
| C47 | .022/600 v |
| C48 | .1/400 v |
| C49 | .68/100 v |
| C50 | 250 pfMica |
| C51 | .022/600 v |
| C52 | .022/600 v |
| C53 | .1/400 v |
| C54 | .047/600 v |
| C55 | 22 uf/100 v |
| C56 | .68/100 v |
| C57 | 10 uf/16 v-axial |
| C59 | .01/50 vdisc |
| C60 | .01/50 vdisc |
| C61 | .01/50 vdisc |
| C62 | 100 pfdisc |
| D12 | T1 LED/red |
| D13 | T1 LED/red |
| P1 | 1M audio |
| P2 | 1M audio |
| P3 | 25k audio |
| P4 | 500k audio |
| P5 | 250k linear |
| P6 | 25k audio |
| P7 | 1M audio |
| P8 | 250k linear |
| P9 | 1M audio |
| P10 | 25k linear |
| P11 | 250k linear |
| P12 | 5k linear |
| R9 | 750R/5W |
| R18 | 10K |
| R19 | 1M |
| R20 | 33K |
| R21 | 2K2 |
| R22 | 220K |
| R23 | 470K |
| R24 | 220K |
| R25 | 1K |
| R26 | 2K2 |
| R27 | 560K |
| R28 | 47K |
| R29 | 56K |
| R30 | 47K |
| R31 | 560K |
| R32 | 470R |
| R33 | 560K |
| R34 | 100K |
| R35 | 470K |
| R36 | 8K2 |
| R37 | 100K |
| R38 | 470K |
| R39 | 125R/5W |

-continued

| Part No. | Part Description |
|---|---|
| R40 | 100R/1W |
| R41 | 100R/1W |
| R42 | 8K2 |
| R43 | 8 ohm/50W |
| R45 | 1K |
| R46 | 47K |
| R47 | 100K |
| R48 | 220K |
| R49 | 220K |
| R50 | 100K |
| R51 | 100K |
| R52 | 27K |
| R53 | 3K3 |
| R54 | 2K7 |
| R55 | 1M |
| R56 | 100K |
| R57 | 330K |
| R58 | 1M |
| R60 | 1K/5W |
| R61 | 1K/5W |
| R62 | 1K/5W |
| R63 | 1K/5W |
| R64 | 5K6 |
| R65 | 5K6 |
| R66 | 5K6 |
| R67 | 5K6 |
| R68 | 180K |
| R69 | 180K |
| R70 | 82K |
| R71 | 100K |
| R72 | 100K |
| R73 | 470K |
| R74 | 750K |
| R75 | 750K |
| R76 | 10K |
| R77 | 4K7 |
| R78 | 27K |
| R79 | 1K5 |
| R80 | 68K |
| R81 | 33K |
| R82 | 10K |
| R83 | 220K |
| R84 | 100K |
| R85 | 1K |
| R86 | 680K |
| R87 | 1M |
| R88 | 100K |
| R89 | 1K5 |
| R90 | 1M |
| R91 | 220K |
| R92 | 220K |
| R93 | 100K |
| R96 | 47K |
| R97 | 10K |
| R100 | 47K |
| R101 | 10K |
| R102 | 180K |

Vacuum tubes V6 and V7 can be 6BQ5/EL84, tubes V10–VI3 can be 6CA7/EL34, and all other tubes can be 12AX7A/ECC83. Transformer TR2 can be an iron core transformer with a 8K center-tapped primary, an eight-ohm secondary, and a 600 ohm secondary. Transformer TR3 can be an iron core transformer with a 2K5 center-tapped primary, and a secondary having taps at four, eight, and sixteen ohms.

The following table lists the voltage supply levels for the various power supply nodes shown in FIGS. 5a–5c.

| Node Ref. | Voltage |
|---|---|
| A | +450 vDC |
| B | +448 vDC |
| C | +375 vDC |
| D | +370 vDC |
| E | +295 vDC |
| F | +232 vDC |
| G | +188 vDC |
| H | +164 vDC |
| J | +146 vDC |
| K | −50 vDC |
| L | +10.6 vDC |

Figure 6:
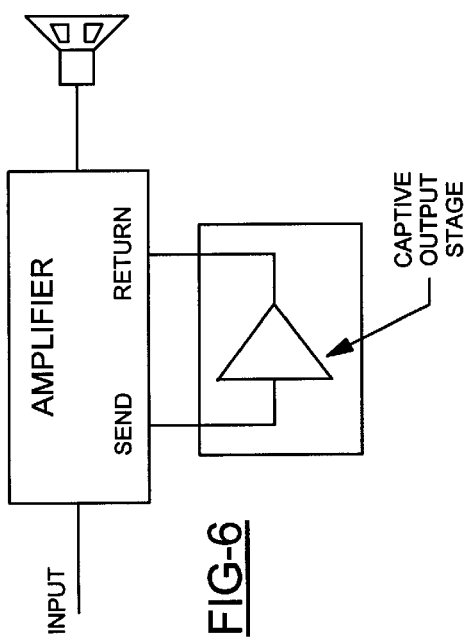
FIG. 6 is a block diagram of a second embodiment of the musician's amplifier of the present invention.

Turning now to FIG. 6, a second embodiment of the invention is shown in which an external device having a complete, captive output stage is connected to the external effects loop of a conventional amplifier. In this way, a conventional amplifier having circuitry for an external effects loop can be used to achieve the desired overdriven sound at any volume level. In this embodiment, a captive output stage, such as output stage 28 of FIG. 5b, is incorporated into an external device that is then connected to the conventional amplifier by placing the device into the external effects loop. This allows the output of the pre-amplifier to be overdriven before the signal is fed is into the power amplifier section of the conventional amplifier. This permits the desired overdriven sound to be produced at any volume level without modification of the amplifier.

Figure 7:
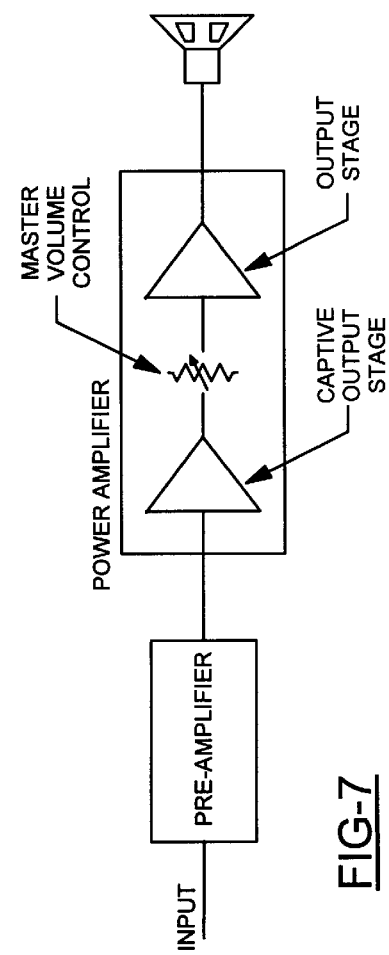
FIG. 7 is a block diagram of a third embodiment of the musician's amplifier of the present invention.

In a third embodiment shown in FIG. 7, a captive output stage, such as that used in the pre-amplifier section 12 of FIGS. 4 and 5b is combined with a conventional power amp stage to form a standalone device that can then be connected to the receive the output of a separate pre-amplifier. In this way, the desired overdriven sound can be produced using a separate rack-mounted or other existing pre-amplifier.

Figure 8:
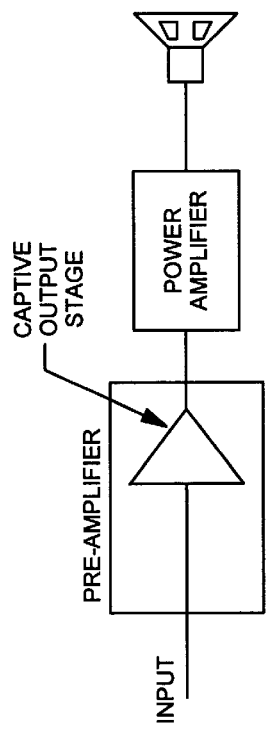
FIG. 8 is a block diagram of a fourth embodiment of the musician's amplifier of the present invention.

In the fourth embodiment shown in FIG. 8, a pre-amplifier section (together with a captive output stage) such as shown in FIGS. 4, 5a, and 5b is provided as a standalone device that can then be connected to the input of a separate power amplifier (such as the power amplifier section 16 shown in FIGS. 4 and 5c). In this way, the desired overdriven sound can be generated using a separate power amplifier.

It will thus be apparent that there has been provided in accordance with the present invention a musician's amplifier which achieves the aims and advantages specified herein. It will of course be understood that the foregoing description is of a preferred exemplary embodiment of the invention and that the invention is not limited to the specific embodiment shown. For example, although the illustrated embodiment utilizes vacuum tubes, it will be appreciated that solid state circuits that provide suitable simulation of the characteristics of tube amplifiers could be used. Various other changes and modifications will become apparent to those skilled in the art and all such variations and modifications are intended to come within the scope or the appended claims.

We claim:

1. A musician's amplifier for use in producing an overdriven sound over a wide range of different volume levels, comprising:

a pre-amplifier section having an input and at least one amplifier stage coupled to said input, whereby said amplifier stage amplifies audio signals received through said input;

a power amplifier section having an output and at least one output stage coupled to said pre-amplifier section to receive the amplified audio signals, said output stage having a volume control and one or more audio power devices coupled to said output, whereby a speaker connected to said output can be driven by said audio power device(s) at a volume level that is set by said volume control;

wherein said amplifier stage of said pre-amplifier section comprises an intermediate output stage That includes a dummy load and one or more additional audio power devices that are separate from said audio power device (s) of said power amplifier section, said additional audio power devices comprising one or more high current, low voltage gain audio power pentode tubes, with said dummy load being coupled to said additional audio power devices(s) to receive and dissipate energy supplied by said additional audio power device(s); and wherein said amplifier stage of said pre-amplifier section has a gain that is adjustable between a low gain setting and a high gain setting, said additional audio power device(s) being overdriven when said gain is at said high gain setting, whereby said pre-amplifier section can produce an overdriven sound that is used by said audio power device(s) of said power amplifier section to drive a speaker at a volume level set by said volume control.

2. A musician's amplifier as defined in claim 1, wherein said audio power devices of said amplifier stage and said output stage comprise audio power vacuum tubes.

3. A musician's amplifier as defined in claim 1, wherein said intermediate output stage comprises a captive output stage that generates the amplified audio signals using said additional audio power device(s), and wherein said captive output stage is coupled to said power amplifier section such that the amplified audio signals are only used internally within said musician's amplifier.

4. A musician's amplifier as defined in claim 1, wherein said amplifier stage further comprises an adjustable level control coupled between said additional audio power device (s) and said power amplifier section, said level control being operable to attenuate the amplified audio signals provided by said additional audio power device(s) and to provide the attenuated signals to said power amplifier section.

5. A musician's amplifier as defined in claim 1, wherein said pre-amplifier section further comprises at least one pre-amplifier coupled between said input and said additional audio power device(s).

6. A musician's amplifier as defined in claim 1, wherein said dummy load comprises a resistor having a wattage rating of at least twenty watts.

7. A musician's amplifier as defined in claim 1, further comprising a speaker connected to said output.

8. A musician's amplifier as defined in claim 1, further comprising:

an effects section coupled between said pre-amplifier section and said power amplifier section, said effects section including a send jack and a return jack for sending the amplified audio signals to an external circuit and returning modified audio signals from the external circuit; and an effects mixer having a first input that receives the amplified audio signals and a second input that receives the modified audio signals, said effects mixer including at least one user-adjustable circuit element connected in circuit to permit adjustment of the relative strength of said amplified audio signals and said modified audio signals.

9. A musician's amplifier as defined in claim 1, wherein said volume control comprises a master volume control.

10. A musician's amplifier for use in producing an overdriven sound over a wide range of different volume levels, comprising:

a pre-amplifier section having an input and at least one amplifier stage coupled to said input, whereby said amplifier stage amplifies audio signals received through said input;

a power amplifier section having an output and at least one output stage coupled to said pre-amplifier section to receive the amplified audio signals, said output stage having a volume control and one or more audio power devices coupled to said output, whereby a speaker connected to said output can be driven by said audio power device(s) at a volume level that is set by said volume control;

wherein said amplifier stage of said pre-amplifier section includes a dummy load, transformer, and one or more additional audio power devices that are separate from said audio power device(s) of said power amplifier section, said dummy load being coupled to one or more outputs of said additional audio power device(s) and said transformer being connected between said additional audio power device(s) and said dummy load, whereby said dummy load is driven via said transformer by said additional audio power device(s) using the amplified audio signals; and wherein said amplifier stage of said pre-amplifier section has a gain that is adjustable between a low gain setting and a high gain setting, said additional audio power device(s) being overdriven when said gain is at said high gain setting, whereby said pre-amplifier section can produce an overdriven sound that is used by said audio power device(s) of said power amplifier section to drive a speaker at a volume level set by said volume control.

11. A musician's amplifier as defined in claim 10, wherein said transformer includes first and second secondary windings, with said dummy load being connected in circuit to receive energy from said first secondary winding and said power amplifier section being connected in circuit to receive the amplified audio signals via said second secondary winding.

12. A musician's amplifier as defined in claim 10, further comprising a level control circuit coupled between said transformer and said power amplifier section, said level control circuit including a user-adjustable element that permits attenuation of the amplified audio signals generated by said amplifier stage.

13. An amplifier apparatus for connecting as an external effects loop to a musician's amplifier having volume control and an effects section that includes a send jack and a return jack, the amplifier apparatus comprising:

an amplifier circuit having an input for connecting to the send jack and an output for connecting to the return jack, said amplifier circuit including an output stage having a dummy load and one or more audio power devices coupled to said dummy load, said audio power device(s) comprising high current, low voltage gain audio power pentode tube(s), said amplifier circuit having a gain that is adjustable between a low gain setting and a high gain setting, said audio power device(s) being overdriven when said gain is at said high gain setting, whereby said amplifier circuit can produce overdriven audio signals from audio signals received on said input and provide the overdriven audio signals to said output for use by the musician's amplifier to produce an overdriven sound at a level that is set by the volume control.

14. An amplifier apparatus as defined in claim 13, wherein said amplifier circuit further comprises an adjustable level control coupled between said audio power device(s) and said output, said level control being operable to attenuate the signals provided by said audio power device(s) and to provide the attenuated signals to said output.

15. A musician's power amplifier apparatus for connecting to a standalone pre-amplifier, the power amplifier apparatus comprising:

a first power amplifier section having an input and at least one amplifier stage coupled to said input whereby said amplifier stage amplifies audio signals received from the pre-amplifier through said input;

a second power amplifier section having an output and at least one output stage coupled to said first power amplifier section to receive the amplified audio signals, said output stage having a volume control and one or more audio power devices coupled to said output, whereby a speaker connected to said output can be driven by said audio power device(s) at a volume level that is set by said volume control;

wherein said amplifier stage of said first power amplifier section comprises an intermediate output stage that includes a dummy load and one or more additional audio power devices that are separate from said audio power device(s) of said power amplifier section, said additional audio power devices comprising one or more high current, low voltage gain audio power pentode tubes, with said dummy load being coupled to said additional audio power device(s) to receive and dissipate energy supplied by said additional audio power device(s); and wherein said amplifier stage of said first power amplifier section has a gain that is adjustable between a low gain setting and a high gain setting, said additional audio power device(s) being overdriven when said gain is at said high gain setting, whereby said first power amplifier section can produce an overdriven sound that is used by said audio power device(s) of said second power amplifier section to drive a speaker at a volume level set by said volume control.

16. A musician's amplifier as defined in claim 15, wherein said intermediate output stage comprises a captive output stage that generates the amplified audio signals using said additional audio power device(s), and wherein said captive output stage is coupled to said second power amplifier section such that the amplified audio signals are only used internally within said musician's power amplifier apparatus.

17. A musician's amplifier as defined in claim 15, wherein said amplifier stage further comprises an adjustable level control coupled between said audio power device(s) and said second power amplifier section, said level control being operable to attenuate the amplified audio signals provided by said audio power device(s) and to provide the attenuated signals to said second power amplifier section.

18. A pre-amplifier apparatus for connecting to a musician's power amplifier having volume control, the pre-amplifier apparatus comprising:

an input for connecting to a musical device to receive audio signals therefrom;

an output for connecting to the power amplifier;

at least one amplifier stage coupled between said input and said output, said amplifier stage comprising an output stage having a dummy load and one or more audio power devices coupled to said dummy load, said audio power device(s) comprising high current, low voltage gain audio power pentode tube(s), said amplifier stage having a gain that is adjustable between a low gain setting and a high gain setting, wherein said amplifier stage amplifies the audio signals using said gain and wherein said audio power device(s) are overdriven when said gain is at said high gain setting, whereby said amplifier stage can produce an overdriven sound that is used by the power amplifier to drive a speaker at a volume level set by the volume control.

19. A pre-amplifier apparatus for connecting to a musician's power amplifier having volume control, the pre-amplifier apparatus comprising:

an input for connecting to a musical device to receive audio signals therefrom;

an output for connecting to the power amplifier;

at least one amplifier stage coupled between said input and said output said amplifier stage comprising an output stage having a dummy load and one or more audio power devices coupled to said dummy load, said amplifier stage having a gain that is adjustable between a low gain setting and a high gain setting, wherein said amplifier stage amplifies the audio signals using said gain and wherein said audio power device(s) are overdriven when said gain is at said high gain setting, whereby said amplifier stage can produce an overdriven sound that is used by the power amplifier to drive a speaker at a volume level set by the volume control;

wherein said amplifier stage further comprises a transformer coupled between said audio power device(s) and said dummy load.

20. A pre-amplifier apparatus as defined in claim 19, wherein said amplifier stage further comprises an adjustable level control coupled between said audio power device(s) and said output, said level control being operable to attenuate the amplified audio signals provided by said audio power device(s) and to provide the attenuated signals to said output.

* * * * *

UNITED STATES PATENT AND TRADEMARK OFFICE
CERTIFICATE OF CORRECTION

PATENT NO.    : 6,111,961
DATED         : August 29, 2000
INVENTOR(S)   : Guy L. Hendrick and Franco LaMarra It is certified that error appears in the above-identified patent and that said Letters Patent is hereby corrected as shown below:

Column 4,
Lines 11-12, delete "CHANNBL" and insert therefor -- CHANNEL --.

Column 6,
Line 10, delete "200" and insert therefor -- 220 --.
Lines 23 and 24, delete "0.47" and insert therefor -- .047 --.

Signed and Sealed this

Twenty-sixth Day of February, 2002

Attest:

JAMES E. ROGAN
Attesting Officer        Director of the United States Patent and Trademark Office